United States Patent

[11] 3,629,619

[72] Inventors Johannes Anton Greefkes; Karel Riemens, both of Emmasingel, Eindhoven; Geerlof Jan Korevaar; Van Dijh Leonardus Petrus Jozef, both of Hilversum, all of Netherlands

[21] Appl. No. 860,649
[22] Filed Sept. 24, 1969
[45] Patented Dec. 21, 1971
[73] Assignee U.S. Philips Corporation New York, N.Y.
[32] Priority Sept. 27, 1968
[33] Netherlands
[31] 6813832

[54] DEVICE INCLUDING A COMPARISON STAGE IN THE FORM OF A BISTABLE TRIGGER
9 Claims, 2 Drawing Figs.

[52] U.S. Cl. .......... 307/264, 307/235, 307/291, 307/297
[51] Int. Cl. .......... H03k 5/20
[50] Field of Search .......... 307/235, 291, 297, 264

[56] References Cited

UNITED STATES PATENTS

| | | | |
|---|---|---|---|
| 2,920,215 | 1/1960 | Lo .......... | 307/291 X |
| 3,309,614 | 3/1967 | Schlein .......... | 307/235 X |

*Primary Examiner*—Donald D. Forrer
*Assistant Examiner*—John Zazworsky
*Attorney*—Frank R. Trifari

ABSTRACT: A device for furnishing a stable reference level voltage for an input signal subject to periodic sampling, comprising a bistable trigger, a pulse generator which causes the bistable trigger to conduct in one of its balanced states in accordance with the relative magnitude of the input signal source with respect to the reference level voltage, and a direct voltage stabilization circuit coupled to the output of the bistable trigger for providing feedback to adjust the reference level voltage to agree with a fixed reference voltage.

Figure 1:
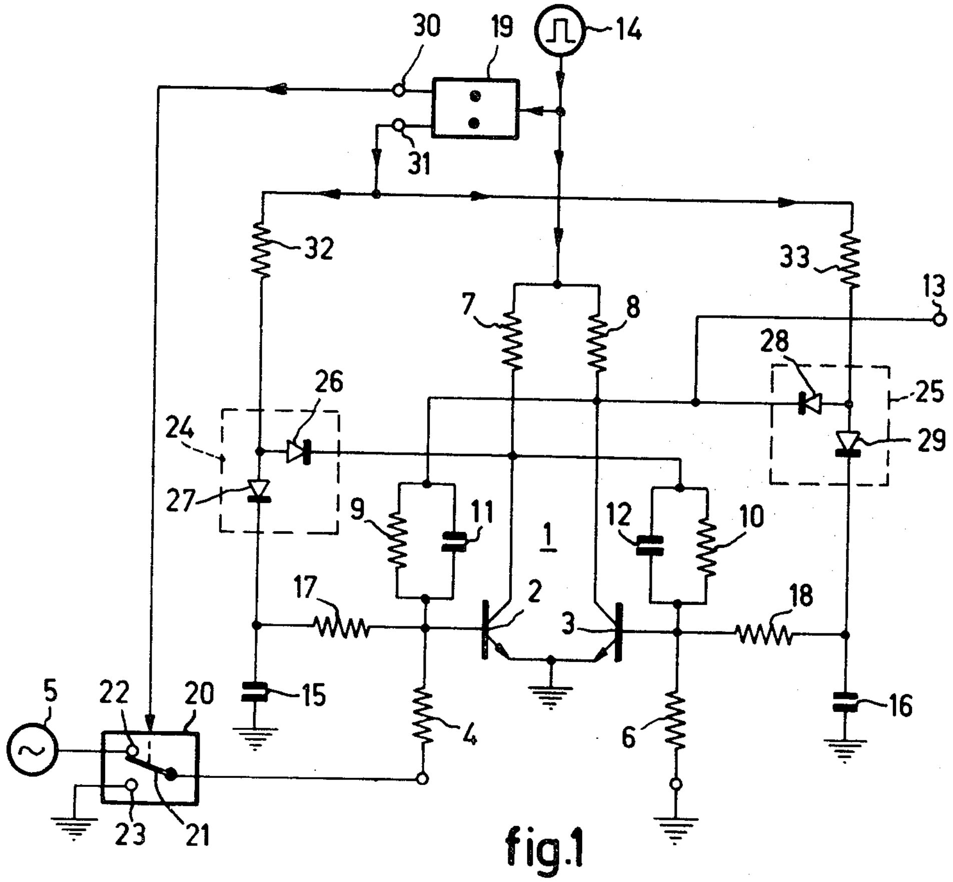

INVENTORS
JOHANNES A. GREEFKES
KAREL RIEMENS
GEERLOF J. KOREVAAR
LEONARDUS P. J. VAN DIJK
BY
AGENT

INVENTORS
JOHANNES A. GREEFKES
KAREL RIEMENS
GEERLOF J. KOREVAAR
LEONARDUS P. J. VAN DIJK
BY
AGENT

DEVICE INCLUDING A COMPARISON STAGE IN THE FORM OF A BISTABLE TRIGGER

The invention relates to a device including a comparison stage in the form of a bistable trigger comprising a first amplifier element and a second amplifier element which are relatively fed back by a mutual DC coupling, an input signal originating from an input signal source being applied to an input of the first amplifier element, and a reference voltage being applied to an input of the second amplifier element, a pulse generator being connected to the bistable trigger which activates the trigger only upon occurrence of a pulse from the pulse generator and causes the trigger to select one of its balanced positions in accordance with the input signal. The amplifier elements may be formed by amplifier valves or transistors.

Dependent on the input signal from the input signal source being located above or below the reference voltage, the first amplifier element will be conducting and the second amplifier element will be blocked upon the occurrence of a pulse from the pulse generator, or conversely, the first amplifier element will be blocked and the second amplifier element will be conducting, so that an output signal formed from 0 to 1 pulses is produced at the output circuits of the amplifier elements in the rhythm of the pulses from the pulse generator, said output signal indicating whether the input signal from the input signal source is located above or below the reference voltage. Due to their great sensitivity such triggers controlled by a pulse generator may advantageously be used in practice for determining small differences between the input signal and the reference voltage, for example, when carefully constructing such bistable triggers it is possible to reliably determine differences of the input signal relative to the said reference voltage in the order of $10^{-5}$ to $10^{-6}$ v.

It is an object of the invention to provide, with simplicity of construction, a particularly effective and sensitive stabilization of the DC biasing in such a device including a bistable trigger influences by tolerances in the elements, supply voltage variations, temperature variations etc. being obviated to a great extent.

The device according to the invention is characterized in that for stabilizing the DC biasing of the device at the reference voltage the bistable trigger also performs the function of a stabilization voltage generator, because the two output circuits of the amplifier elements which supply complementary 1 and 0 pulses are connected to a direct voltage stabilization circuit which is furthermore provided with a smoothing filter for generating a direct voltage by smoothing the pulses applied thereto, and with a difference producer, the direct-voltage stabilization circuit being connected to the device as a negative feedback circuit.

Figure 2:
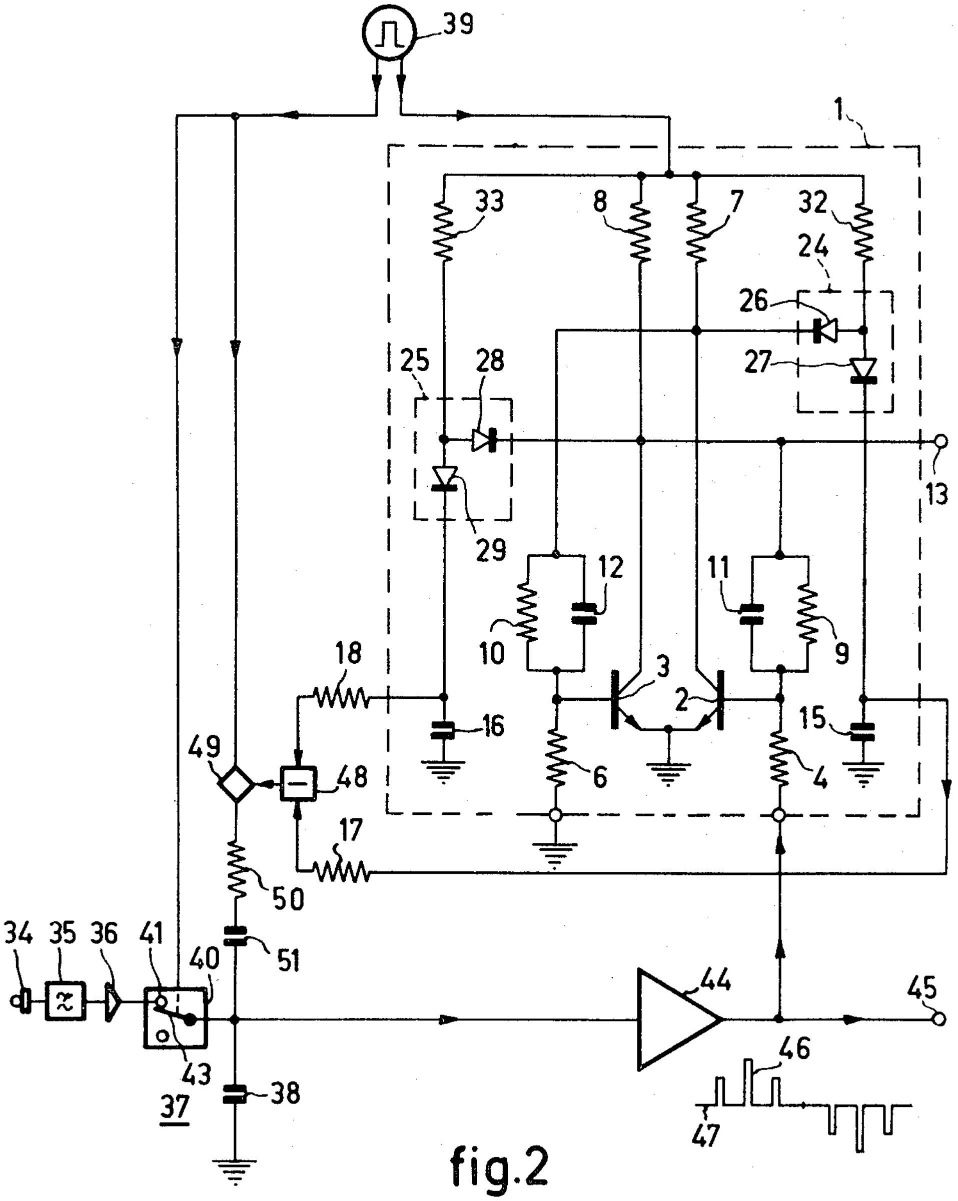

In order that the invention may be readily carried into effect, a few embodiments thereof will now be described in detail, by way of example with reference to the accompanying diagrammatic drawings, in which:

FIG. 1 shows a device according to the invention while FIG. 2 shows a further embodiment of a device according to the invention.

In FIG. 1, the device according to the invention is formed as a comparison stage 1 in the form of a bistable trigger comprising a first transistor 2 and a second transistor 3 which are relatively fed back by a mutual DC coupling, an input signal from an input signal source 5 being applied to the base of the transistor 2 through a resistor 4, and a reference voltage which is formed by earth potential being applied to the base of the transistor 3 through a resistor 6. In the embodiment of the bistable trigger the collector circuits of the transistors 2 and 3 include collector resistors 7 and 8 and the emitters are connected in common to earth, while the mutual DC feedback coupling is provided between the collectors of the transistors 2 and 3 and the bases of the transistors 3 and 2, respectively, the DC feedback coupling being formed by the parallel arrangement of resistors 9 and 10 and capacitors 11 and 12 respectively. The output voltage of the comparison stage 1 is derived through output terminal 13 from one of the collector resistors of the transistors, for example, from the collector resistor 8 of the transistor 3.

The two transistors 2 and 3 of the trigger are fed by a pulse generator 14 which activates the trigger only upon the occurrence of a pulse from the pulse generator 14 and causes the trigger to select one of its balanced positions in accordance with the input signal. In fact, dependent on the input signal from the input signal source 5 being located above or below the reference voltage, the trigger will either occupy one balanced position at which transistor 2 is bottomed and transistor 3 is cut off, or it will occupy the other balanced position at which transistor 2 is cut off and transistor 3 is bottomed. Thus, a series of 1 and 0 pulses occur at the output terminal 13 of the trigger in the rhythm of the pulses from the pulse generator 14, which pulses indicate whether the signal voltage is either above or below the reference voltage.

Small difference of the signal voltage relative to the reference voltage can be distinguished with great accuracy with the aid of the comparison stage 1 described so far, for example, in case of a difference of $+10^{-5}$ v. of the signal voltage relative to the reference voltage the transistor 2 is bottomed, the transistor 3 is cut off and a 1 pulse occurs at the output terminal 13, whereas in case of difference of $-10^{-5}$ v. the transistor 2 is cut off and the transistor 3 is bottomed and a 0 pulse occurs at the output terminal 13. Thus, differences between signal voltage and reference voltage in the order of $\pm 10^{-5}$ v. can still be distinguished reliably with the aid of the device described.

Eminent results were obtained in practice with the device described, but under given circumstances this great accuracy of distinction was found to decrease by approximately a factor of 10, which is undesirable for certain uses. As was found from extensive experiments the cause of this decrease in the accuracy of distinction is mainly to be ascribed to an unequal load of the transistors 2, 3, that is to say, the number of times of the transistor 3 being bottomed, as reckoned over a given course of time, is unequal to the number of times of the transistor 2 being bottomed. This unequal load becomes manifest in a mutually unequal DC biasing of the transistors 2, 3.

According to the invention a particularly effective stabilization of the DC biasing is obtained in a simple manner in the device described including a comparison 1 in the form of a bistable trigger, because the bistable trigger also performs the function of a stabilization voltage generator for which purpose the two output circuits 7, 8 of the transistors 2, 3 which supply complementary 1 and 0 pulses are connected to a direct-voltage stabilization circuit which is furthermore provided with smoothing filters including smoothing capacitors 15, 16 for generating direct voltages by smoothing the pulses applied thereto, which pulse are applied in a negative feedback sense to the bases of the transistors 2, 3 through resistors 17, 18. The transistors 2, 3 act as difference producers for the generated direct voltages.

To this end, in the embodiment shown, the direct-voltage stabilization circuit is periodically connected to the output circuit of the comparison stage 1 from a frequency divider 19 connected to the pulse generator 14, for example, at a division ratio of 8. Selection gates in the form of AND-gates 24, 25 including diodes 26, 27 and 28, 29 respectively, arranged in series with each of the smoothing capacitors 15, 16 are connected to the output circuits 7, 8 of the transistors 2, 3 while an electronic switch having switching contacts 21 and contacts 22, 23 is included between the signal source 5 and the base of the transistor 2, contact 23 being connected to the fixed reference voltage of earth potential. The frequency divider 19 is provided with two output terminals 30, 31 which supply pulses shifted over a small internal of time, the output terminal 30 being connected to the electronic switch 20 and the output terminal 31 being connected in parallel arrangement to the AND-gates 24, 25 through resistors 32, 33.

In sequence of time and every time shortly before the eighth pulse from the pulse generator 14, the switching contact 21 of the electronic switch 20 will be connected to the earthed contact 23 by means of a pulse from the output terminal 30 of the frequency divider 19, while during, but after the beginning of the eighth pulse from the pulse generator 14 a pulse from the output terminal 31 of the frequency divider 19 is applied through the resistors 32, 33 to the AND-gates 24, 25. Dependent on the transistor 2 being cut off and the transistor 3 being bottomed, or conversely, the transistor 2 being bottomed and the transistor 3 being cut off, either a pulse will be applied to the capacitor 15 through the AND-gate 24 and the resistor 32, or to the capacitor 16 through the AND-gate 25 and the resistor 33. For example, if in one balanced position of the trigger the transistor 2 is cut off and the transistor 3 is bottomed, then the diode 26 of the AND-gate 24 is blocked and the diode 27 is conducting so that the pulse from the output terminal 31 of the frequency divider 19 can reach the capacitor 15 through the resistor 32, and the diode 28 of the AND-gate 25 is conducting and the diode 29 is blocked so that the pulse from the frequency divider 31 through the conducting diode 28 and the conducting transistor 3 which is then in its bottomed condition, can flow to earth through the emitters. Conversely, if in the other balanced position of the trigger, the transistor 2 is bottomed and the transistor 3 is cut off, then the diode 28 of the AND-gate 25 is blocked and the diode 29 is conducting and the diode 26 of the AND-gate 24 is conducting and the diode 27 is blocked, so that in that case the pulse from the output terminal 31 of the frequency divider 19 can reach the capacitor 16 through the gate 25 and will flow to earth through the gate 24 and the bottomed transistor 2.

The two resistor 32, 33 connected to the output terminal 31 of the frequency divider 19 serves as decoupling resistors for the AND-gates 24, 25 on the one hand, and form together with the capacitors 15 and 16 and the resistors 17 and 18 smoothing filters for generating a direct voltage by smoothing the pulses applied thereto. The time constant of the smoothing filters has been chosen to be sufficiently small so as to be able to follow occurring variations in the bias voltages of the transistors 2, 3 sufficiently quickly, for example, in the embodiment shown this time constant is 0.1 second.

To explain the operation of the device described the starting condition will be that both transistors (2, 3) show equal bias voltages and that mutually equal direct voltages are set up at the capacitors 15, 16 because a mutually equal number of pulses has been applied per unit of time to the capacitors 15, 16. Due to the difference producer action of the two transistors 2, 3 of the trigger, the mutually equal capacitor voltages do not exert influence on the mutual DC biasing of the transistors.

If, starting from this condition, the comparison stage 1 is connected through the switching contact 21 of the electronic switch 20 to the signal source 5, the input signal from the input signal source 5 is compared with the reference voltage in the manner as already stated herein—before whenever a pulse from the pulse generator 14 occurs, mutual differences of $\pm 10^{-5}$ v. still being distinguished reliably. The output voltage of the comparison stage 1 consisting of 1 and 0 pulses is derived from the output terminal 13 connected to the output resistor 8 of the transistor 3.

The base of the transistor 2 is brought to the same reference voltage as the base of the transistor 3 through the switching contact 21 of the electronic switch 20 every time at the eighth pulse from the pulse generator 14, and now the bias voltages of the transistors 2, 3 are mutually compared, mutual differences in the bias voltages of $10^{-5}$ v. being indicated reliably, for example, if the transistor 2 has a bias voltage which is $10^{-5}$ v. higher than that of the transistor 3, the transistor 2 will be bottomed and the transistor 3 will be cut off in the manner as indicated upon the occurrence of a pulse from the pulse generator 14, with the result that a pulse is applied to the capacitor 16 through the gate 25, which pulse counteracts the mutual inequality of the bias voltages of the transistors 2, 3 due to the increase of the bias voltage of the transistor 3. At the next eighth pulse from the pulse generator 14 the bias voltages of the transistors 2, 3 are again compared with each other, and again differences occurring in the bias voltages of the transistors 2, 3 being counteracted by a pulse at the capacitor of the transistor having the lowest bias voltage, and so forth. Thus, the device described tends to render the bias voltages of the two transistors 2, 3 mutually equal.

The most surprising effect of a direct-voltage stabilization within $10^{-5}$ v. is obtained with the device described, influences by tolerances and variation etc. of the different elements of the device being obviated to a great extent.

Not only does the device described provide the advantage of a direct-voltage stabilization within $10^{-5}$ v. independently of tolerances of the different elements, but it is also largely independent of supply voltage variations, variations of duration, amplitude and frequency of the pulses from the pulse generator 14 and the frequency divider 19. In fact, such variations only result in the voltages of the two capacitors 15 and 16 varying in an equal manner which does not exert any influence on the mutual DC biasing of the transistors 2, 3. The above-mentioned remarkable results are obtained when using the steps according to the invention, while providing simplicity of structure and without imposing special requirements on the construction of the different elements.

The above-mentioned special advantages of the direct-voltage stabilization control shown renders this device also attractive for other uses in which an accurate direct-voltage stabilization is required, for example, in a sampling device for pulse code modulation systems in which the samplings derived from the sampling device must be stabilized on a reference level which may vary due to leakage of the sampling device.

Such a device is shown in FIG. 2 and includes a microphone 34, a speech filter 35 having a passband of 300–3400 Hz. and a microphone amplifier 36 which is connected to a sampling device 37. The sampling device 37 is provided with a sampling capacitor 38 and an electronic switch 40 having a contact 41 and a switching contact 43 connected to a pulse generator 39, the samplings of the speech signal to be transmitted occurring at the sampling capacitor 38 being applied to an output terminal 45 after amplification in an amplifier 44 for the purpose of further handling, for example, in a pulse code modulator.

Whenever a pulse from the pulse generator 39 occurs, the sampling capacitor 38 is connected through the switching contact 43 and the contact 41 of the electronic switch 40 to the output of the microphone amplifier 36 and subsequently this connection is interrupted. For illustration the reference numeral 46 diagrammatically shows the generated samplings in FIG. 2 in which the zero level or reference level 47, that is to say, in the absence of a speech signal which is chosen to be equal to earth potential in the embodiment shown, can be influenced by the leakage of the electronic switch 40 and by drift of the amplifiers 36 and 44.

To stabilize the reference level of the samplings 46 at earth potential, these samplings of the speech signal which vary in amplitude are applied to a comparison stage 1 including a bistable trigger which has extensively been described with reference to FIG. 1. Corresponding elements have the same reference numerals.

Whenever a sampling occurs at the base of the transistor 2, a pulse from the pulse generator 39 is applied to the comparison stage 1 and this sampling is compared with the reference level of the comparison stage 1, which in this embodiment has been rendered equal to earth potential, the samplings varying in amplitude being converted in a series of 1 and 0 pulses of constant amplitude, which 1 and 0 pulses characterize whether the samplings varying in amplitude are either above or below the reference level. For use in pulse code modulation the polarity pulses for the pulse series to be transmitted can directly be derived from the output terminal 13 connected to the output resistor 8.

The desired stabilization of the DC biasing is obtained with this device in the manner as already extensively described with reference to FIG. 1. Particularly the output circuits 7, 8 of the transistors are again connected through the AND-gates 24, 25 to the direct-voltage stabilization circuit, the AND-gates 24, 25 being connected through resistors 32, 33 to the pulse generator 39. Likewise as in the embodiment of FIG. 1, the resistors 17, 18 and 32, 33 together with the capacitors 15, 16 form the smoothing filter for the pulses applied thereto, the output voltages of the capacitors being applied through resistors 17, 18 to a difference producer 48.

The desired DC stabilization voltage is derived from the output of the difference producer 48. In fact, if a shift of the reference level does not occur, that applies for a speech signal that, viewed over a large period of time, the sum of the time intervals during which the speech signal is above or below the reference level must be mutually equal, with the result that the number of 1 and 0 pulses must be mutually equal so that no stabilization voltage occurs at the output of the difference producer 48 after smoothing in the smoothing filters 32, 17, 15,; 33, 18, 16 and difference production in the difference producer 48.

On the other hand the number of 1 and 0 pulses will no longer be mutually equal if the reference level of the samplings is shifted due to leakage of the electronic switch 40 and drift of the amplifiers 36, 44, which has the result that an output voltage will occur at the output of the difference producer 48, which voltage is proportional in direction and amplitude to the shift of the reference level of the samplings and which can then be utilized for direct current stabilization. To this end, particularly the output voltage of the difference producer 48 is applied as a modulation voltage to a modulator 49 fed by the pulses from the pulse generator 39, the output of said modulator being connected through a resistor 50 and a capacitor 51 as a negative feedback circuit to the sampling capacitor 38.

A stabilization of the reference level of the generated samplings within $10^{-4}$ v. is obtained with the device described, which is amply sufficient for the purpose mentioned so that a separate direct-voltage stabilization of the trigger in the manner as shown in FIG. 1 is not necessary in this case, all the more so because the risk of mutual variation of the DC biasing of the transistor 2, 3 only occurs to a considerably decreased extent since in fact the transistors 2, 3 are substantially equally loaded because as a result of the above-mentioned property of a speech signal the two transistors 2, 3 are substantially bottomed during an equal number of times per unit of time. Likewise as in the embodiment shown in FIG. 1, the described stabilization voltage generator including the trigger is distinguished by its very great sensitivity, great independence of tolerances in the elements used, supply voltage variations, etc.

It is to be noted in this connection that the sequence of the functions of smoothing and difference production in the direct-current stabilization circuit may be interchanged, particularly the pulses from the output circuits 7, 8 of the transistors 2, 3 may first be applied to a difference producer for generating a pulse series composed of pulses of opposite polarity, whereafter the desired stabilization voltage is obtained by smoothing in a smoothing filter. Thus, it is necessary to use only one smoothing filter in this embodiment.

Furthermore it is to be noted that alternatively a slowly varying reference voltage may be utilized instead of a fixed reference voltage, for example, earth potential in the device according to the invention, which may be important under given circumstances. In this case the slowly varying reference voltage is applied to the base of transistor 3.

What is claimed is:

1. A circuit arrangement for producing a stable reference level voltage for an input signal subject to periodic sampling, comprising a bistable trigger circuit having two amplifier elements with mutual DC coupling, means for applying said input signal to one of said amplifier elements, means for applying a reference voltage to the other of said elements, means coupled to each of said elements for producing respective periodic DC potentials at the sampling rate of said input signal and having relative values as determined by the relative degree of conduction of said elements as determined by the said input signal and reference voltage, means for filtering said periodic DC potentials, and means for varying the input potential of one of said amplifiers as determined by the difference in the values of said filtered DC potentials.

2. A device for furnishing a stable reference voltage level for an input signal subject to periodic sampling comprising means for providing an adjustable reference level voltage, means for sampling said input signal, a bistable trigger having first and second amplifiers with mutual direct-current coupling, means to apply said sampling means to the input of said first amplifier, means to apply said reference level voltage to the input of said first amplifier, a fixed reference voltage coupled to the input of said second amplifier, a pulse generator coupled to said bistable trigger and supplying pulses which cause said bistable trigger to conduct in one of its balanced states in accordance with the relative value of said input signal source with respect to said reference voltage and to produce output pulses having corresponding values, a direct-voltage stabilization circuit, means to couple the output of said bistable trigger to said direct-voltage stabilization circuit and means to couple the output of said direct-voltage stabilization circuit to said reference level voltage for adjusting said reference level voltage to the value of said fixed reference voltage.

3. A device as claimed in claim 2 wherein said means to couple said direct-voltage stabilization circuit to the output of said bistable trigger comprises at least one selection gate coupled to said pulse generator.

4. A device as claimed in claim 2 wherein said direct-voltage stabilization circuit comprises a filter for transforming pulses into direct voltage.

5. A device as claimed in claim 2 further comprising means to sample said fixed reference voltage and means to couple said sampled fixed reference voltage to the input of said first amplifier.

6. A device as claimed in claim 5 further comprising a frequency divider coupled to said pulse generator and means to couple said frequency divider to both of said sampling means for providing samples of said input signal and said fixed reference voltage in correspondence to the output pulses of said frequency divider.

7. A device as claimed in claim 6 wherein the combined functions of both of said sampling means is performed by an electronic switch.

8. A device as claimed in claim 4 wherein said means to couple the output of said direct-voltage stabilization circuit comprises a modulator coupled to said pulse generator for modulating pulses from said pulse generator with the output voltage of said direct-voltage stabilization circuit and means to couple the output of said modulator to said reference level voltage for adjusting said reference level voltage to the value of said fixed reference voltage.

9. A device having a stabilized DC bias with respect to a reference voltage for an input signal source having oscillations in value about the reference voltage, comprising a bistable trigger circuit having two amplifier elements with mutual DC coupling, means for applying said input signal source to one of said amplifier elements, means for applying said reference voltage to the other of said elements, a pulse generator coupled to said bistable trigger and supplying pulses which cause said bistable trigger to conduct in one of its balanced states in accordance with the relative value of said input signal source with respect to said reference voltage, capacitor means for indicating the number of times said bistable trigger has conducted in one state, capacitor means for indicating the number of times said bistable trigger has conducted in the other state, means for comparing both of said capacitor means, and means for adjusting said DC bias in accordance with said means for comparing.

* * * * *

UNITED STATES PATENT OFFICE
CERTIFICATE OF CORRECTION

Patent No. 3,629,619 Dated December 21, 1971

Inventor(s) Johannes Anton Greefkes et al.

It is certified that error appears in the above-identified patent and that said Letters Patent are hereby corrected as shown below:

On the title page, [72], "Van Dijh Leonardus Petrus Josef" should read -- Leonardus Petrus Jozef Van Dijk --.

Signed and sealed this 30th day of May 1972.

(SEAL)
Attest:

EDWARD M.FLETCHER,JR.
Attesting Officer

ROBERT GOTTSCHALK
Commissioner of Patents